United States Patent
Vijendra Kumar Lakshmi et al.

(10) Patent No.: US 12,327,024 B2
(45) Date of Patent: Jun. 10, 2025

(54) BLOCK CONVERSION TO PRESERVE MEMORY CAPACITY

(71) Applicant: Micron Technology, Inc., Boise, ID (US)

(72) Inventors: Vinay Vijendra Kumar Lakshmi, Karnataka (IN); Vijaya Janarthanam, Karnataka (IN)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 17/740,827

(22) Filed: May 10, 2022

(65) Prior Publication Data

US 2023/0367486 A1 Nov. 16, 2023

(51) Int. Cl.
*G06F 3/06* (2006.01)

(52) U.S. Cl.
CPC .......... *G06F 3/0619* (2013.01); *G06F 3/0604* (2013.01); *G06F 3/064* (2013.01); *G06F 3/0673* (2013.01)

(58) Field of Classification Search
CPC ...... G06F 3/0619; G06F 3/0604; G06F 3/064; G06F 3/0673
See application file for complete search history.

(56) References Cited

U.S. PATENT DOCUMENTS

| | | | |
|---|---|---|---|
| 2014/0258247 A1* | 9/2014 | Chu | G06F 16/1744 707/693 |
| 2016/0041760 A1* | 2/2016 | Kuang | G11C 16/3495 711/103 |
| 2017/0047124 A1* | 2/2017 | Ellis | G06F 3/0637 |
| 2021/0034541 A1* | 2/2021 | Maeda | G06F 12/0246 |
| 2021/0255927 A1* | 8/2021 | Kannan | G06F 3/064 |
| 2022/0004495 A1* | 1/2022 | Natarajan | G06F 12/123 |

* cited by examiner

*Primary Examiner* — Jigar P Patel
(74) *Attorney, Agent, or Firm* — Holland & Hart LLP

(57) ABSTRACT

Methods, systems, and devices for block conversion to preserve memory capacity are described. A device may perform a quantity of one or more access operations on a block that includes a set of memory cells configured as single-level cells each of which is configured for storing multiple bits. After performing the quantity of one or more access operations on the block the device may convert the set of memory cells from single-level cells into multiple-level cells configured for storing multiple bits. The device may then determine a remaining quantity of access operations permitted to be performed on the block and operate the bloc based on the remaining quantity of access operations.

21 Claims, 8 Drawing Sheets

BLOCK CONVERSION TO PRESERVE MEMORY CAPACITY

FIELD OF TECHNOLOGY

The following relates to one or more systems for memory, including block conversion to preserve memory capacity.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A memory system with blocks of memory cells may configure some blocks as lower density block and other blocks as higher density blocks. For instance, some blocks may be configured as single-level cell (SLC) blocks (e.g., lower density blocks) in which the memory cells are each configured for storing a single bit, whereas other blocks may be configured as multiple-level cell (MLC) blocks (e.g., higher density blocks) in which the memory cells are each configured for storing multiple bits (e.g., 2 bits, 3 bits, 4 bits). As blocks in the memory system begin to degrade over time and become unreliable for storing information, or if blocks are determined to be unreliable at initialization for example, the memory system may retire the unreliable blocks by operating the unreliable blocks as read-only blocks or by avoiding accessing the unreliable blocks altogether. But retiring unreliable blocks reduces the storage capacity of the memory system, particularly if the retired blocks are higher density blocks (which often degrade faster than lower density blocks).

According to the techniques described herein, a memory system that retires higher density blocks may preserve storage capacity by converting lower density blocks into higher density blocks. For example, if the memory system retires an MLC block, the memory system may convert an SLC block into an MLC block. If the converted MLC block has already been subject to one or more access operations, the memory system may use a parameter, such as a conversion factor, to determine a quantity of remaining access operations permitted to be performed on the converted MLC block, which will allow the memory system to determine an appropriate timing (e.g., a predicted timing) to retire the converted MLC block.

Figure 1:
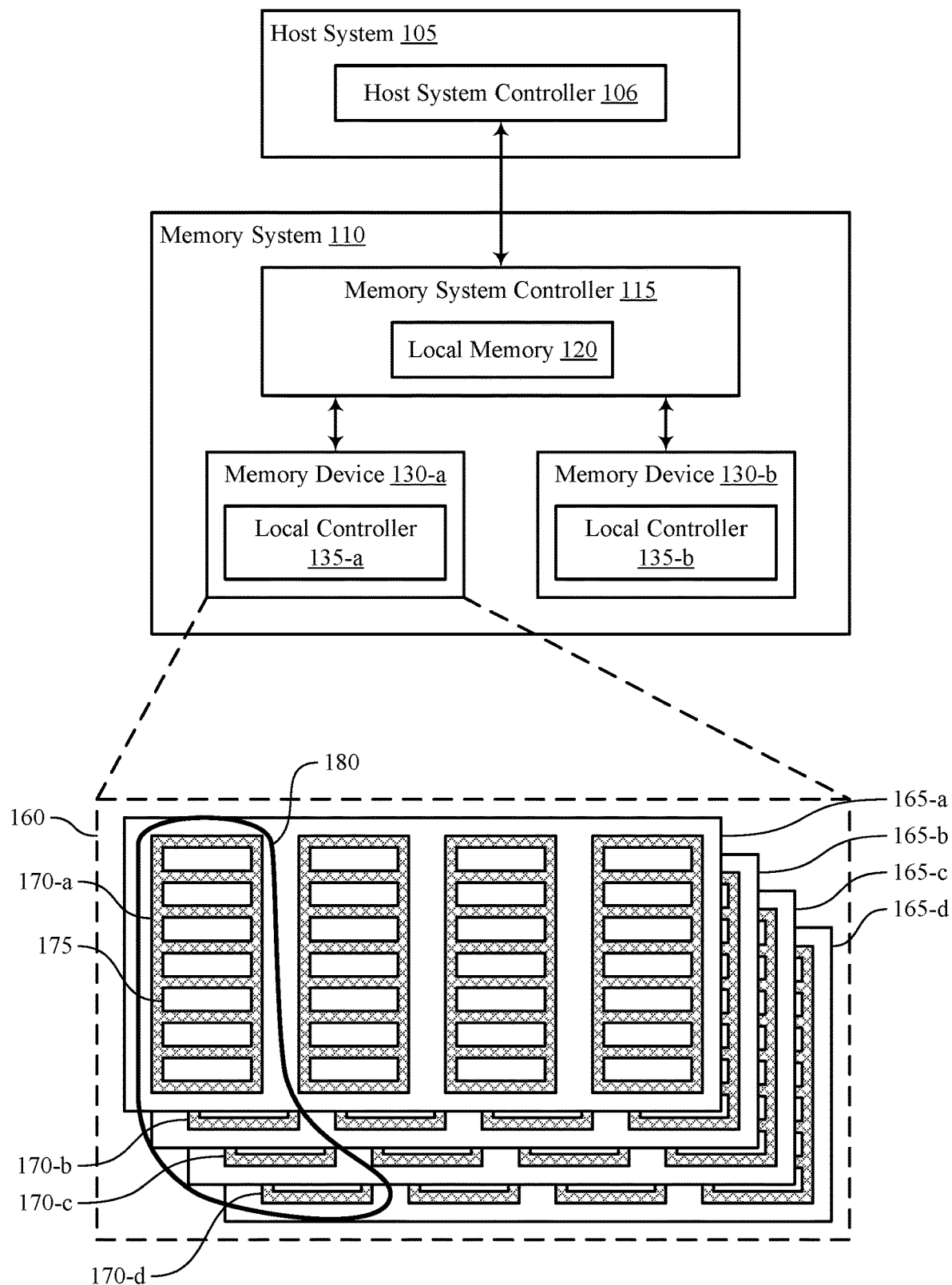
FIG. 1 illustrates an example of a system that supports block conversion to preserve memory capacity in accordance with examples as disclosed herein.
Figure 2:
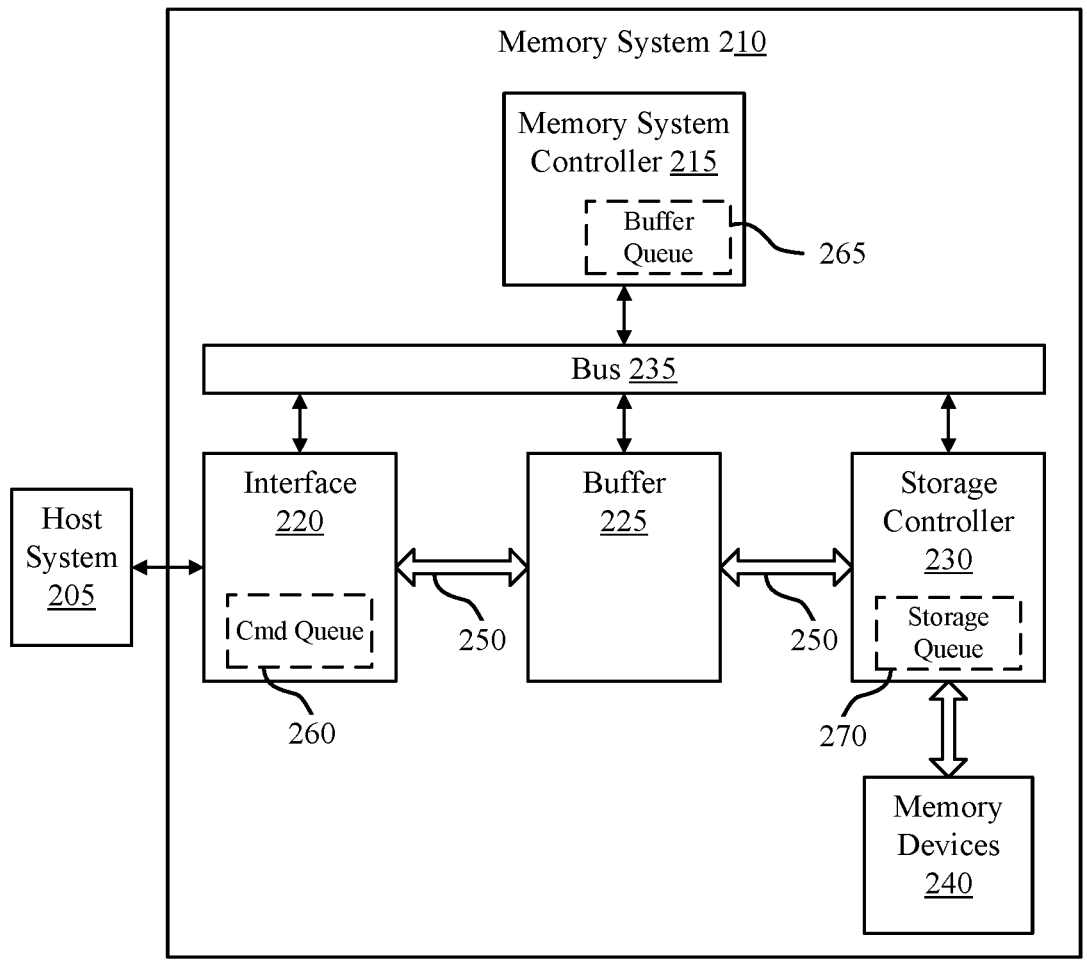
FIG. 2 illustrates an example of a system that supports block conversion to preserve memory capacity in accordance with examples as disclosed herein.

Features of the disclosure are initially described in the context of systems, devices, and circuits with reference to FIGS. 1 through 2. Features of the disclosure are described in the context of logical and physical spaces, planes, and a process flow with reference to FIGS. 3-5. These and other features of the disclosure are further illustrated by and described in the context of an apparatus diagram and flowcharts that relate to block conversion to preserve memory capacity with reference to FIGS. 6-8.

FIG. 1 illustrates an example of a system 100 that supports block conversion to preserve memory capacity in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The memory system 110 may include lower density blocks and higher density blocks. For instance, the memory system 110 may include SLC blocks (e.g., blocks with memory cells configured as single-level cells) and MLC blocks (e.g., blocks with memory cells configured as multiple-level cells). Examples of multiple-level cells include bi-level cells (BLCs) which may be configured to each store two bits of information, tri-level cells (TLCs) which may be configured to each store three bits of information, and quad-level cells (QLCs) which may be configured to each store four bits of information. In general, a memory cell that is configured to store n bits may be configured to support $2^n$ levels. Multiple-level cells may provide greater density of storage relative to single-level cells but may, in some cases, involve narrower read or write margins.

As referred to herein, the terms "lower density block" and "higher density block" may be used to refer to the relative quantity of bits the memory cells in the respective blocks are configured to store. So, a block with memory cells each configured to store x bits and a block with memory cells each configured to store y bits may be referred to as a lower density block and a higher density block, respectively, if x<y. Accordingly, BLC blocks may be referred to as lower density blocks relative to TLC blocks and QLC blocks and may be referred to as higher density blocks relative to SLC blocks. Similarly, TLC blocks may be referred to as lower density blocks relative to QLC blocks and may be referred to as higher density blocks relative to SLC blocks and BLC blocks.

Different types of blocks (e.g., blocks configured with different densities) may degrade at different rates and thus may have different retirement thresholds, where the retirement threshold for a block refers to the total quantity of access operations that are permitted to be performed on the block before the block is retired. For example, higher density blocks (e.g., QLC blocks) may wear out faster than lower density blocks (e.g., SLC blocks), and thus may have a lower retirement threshold. The memory system 110 may monitor the access operations performed on a block and, if the quantity of access operations reaches the retirement threshold for the block, the memory system 110 may retire the block. In some examples, the retirement threshold may be referred to as the end-of-life (EOL) threshold and the access operations may be program and erase cycles (PECs), where a program operation refers to a write operation.

Over time, various blocks in the memory system 110 may reach their retirement threshold and be retired, reducing the capacity of the memory system. According to the techniques described herein, the memory system 110 may preserve capacity by converting lower capacity blocks into higher capacity blocks in response to retiring higher capacity blocks. In essence, the memory system 110 may replace a retired higher density block with a block that has been converted from a lower density block into a higher density block. To ensure that the converted higher density block is retired at the appropriate time, the memory system 110 may determine the remaining quantity of access operations permitted for the converted higher density block (which may have already been subject to one or more access operations before conversion).

The system 100 may include any quantity of non-transitory computer readable media that support block conversion to preserve memory capacity. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

FIG. 2 illustrates an example of a system 200 that supports block conversion to preserve memory capacity in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some examples, a memory device 240 that includes higher density blocks and lower density blocks may retire a higher density block (e.g., due to the higher density block becoming unreliable). According to the techniques described herein, the memory system 210 may preserve the capacity of the memory device 240 by converting a lower density block into a higher density block. In determining the remaining quantity of access operations for the converted higher density block, the memory device 240 may use a conversion factor that helps the memory system 210 accounts for any access operations performed on the converted higher density block before it was converted.

Figure 3:
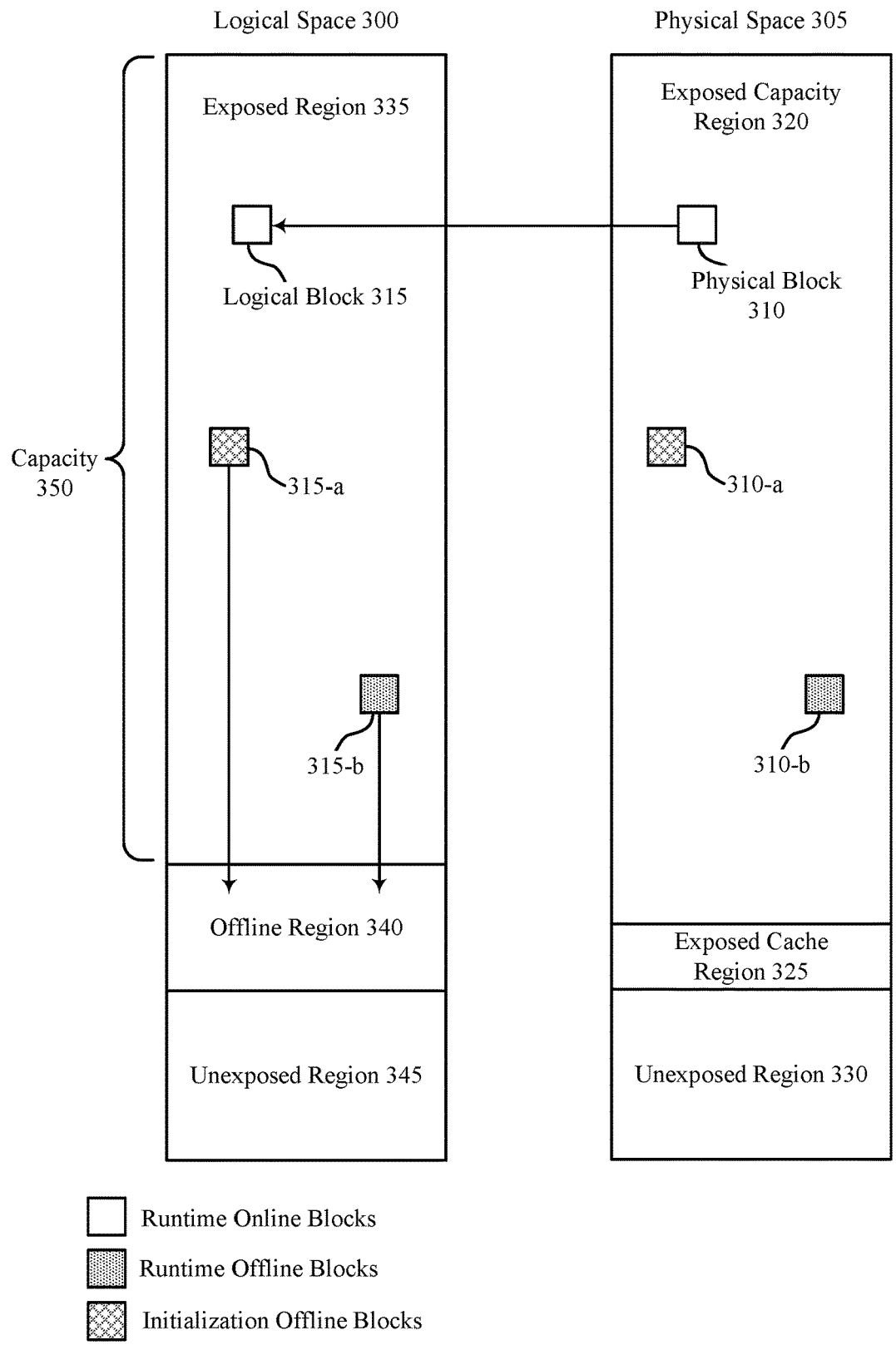
FIG. 3 illustrates an example of a logical space and a physical space that support block conversion to preserve memory capacity in accordance with examples as disclosed herein.

FIG. 3 illustrates an example of a logical space 300 and a physical space 305 that support block conversion to preserve memory capacity in accordance with examples as disclosed herein. The physical space 305 may represent physical blocks 310 in the memory system and the logical space 300 may represent logical blocks 315 that correspond to the physical blocks 310 and that may be used by a host system. The physical blocks 310 may have associated physical addresses and the logical blocks 315 may have associated logical addresses. The memory system may maintain address mapping information, such as tables (e.g., L2P tables), that allow the memory system to translate logical addresses into physical addresses, and vice versa.

The physical space 305 may be divided into the exposed region 320, which may include capacity blocks that may be exposed to (e.g., usable by) the host system, the exposed cache region 325, which may include cache blocks that are exposed to the host system, and the unexposed region 330, which may include blocks (e.g., cache blocks, capacity blocks, reserved blocks) that are unexposed (e.g., not usable by) the host system. A capacity block may refer to a physical block 310 that is for storing data from the host system, metadata, or system information, among other information. A cache block may refer to a physical block 310 that is for moving data between a capacity block and the host system.

The logical space 300 may be divided into the exposed region 335, which may include logical blocks corresponding to exposed capacity blocks, the offline region 340, which may include logical blocks corresponding to blocks that are retired at initialization of the memory system (e.g., on power-up), and unexposed region 345, which may include logical blocks corresponding to unexposed physical blocks.

The size of the exposed region 335 may represent the capacity 350 of the memory system to store data from the host system. If a physical block, such as physical block 310-*a*, is determined to be unreliable (for example at initialization), the physical block may be retired and the corresponding logical block (e.g., logical block 315-*a*) may be added to the offline region 340, thus reducing the capacity 350 of the memory system that is available to the host system (e.g., the size of the exposed region 335 may be reduced). If a physical block, such as physical block 310-*b*, is determined to be unreliable for example at run time (e.g., after initialization), the physical block may be retired and the corresponding logical block (e.g., logical block 315-*b*) may be added to the offline region 340, thus reducing the capacity 350 of the memory system that is available to the host system.

According to the techniques described herein, the memory system may the preserve capacity 350 after retiring a higher density block by converting a lower density block into a higher density block. For example, if the physical block 310-*b* is a higher density block, the memory system may convert a lower density block into a higher density block so that the capacity 350 is undiminished even though the physical block 310-*b* (e.g., the higher density block) is retired. The memory system may select the lower density block from the unexposed region 330 so that full benefit of the conversion is realized compared to converting a lower density capacity block (which may only partially preserve the capacity 350). However, selecting the lower density block from the unexposed region 330 may reduce the quantity of active blocks per unit of data (e.g., the quantity of active blocks per terabyte (TB)), so the memory system may indicate as much to the host system. For instance, the memory system may use a Maximum Active Resource (MAR) field in a control message to indicate that the maximum number of concurrently active resources (e.g., blocks, zones of blocks) has been reduced.

If a lower density block is converted before any access operations are performed on the lower density block (e.g., at initialization), the remaining quantity of access operations for the converted block may be equal to the retirement threshold for higher density blocks. For example, if an SLC block is converted into a QLC block at initialization, the remaining quantity of access operations for the converted QLC block may be equal to the retirement threshold for QLC blocks. However, if a lower density block is converted during run time, the remaining quantity of access operations for the converted block may be less than the retirement threshold for the higher density block (e.g., because the lower density block has already been subject to one or more access operations that degrade the lower density block). In such a scenario, the memory system may determine the quantity of remaining access operations for the converted higher density block by using a conversion factor that helps the memory system account for the access operations already performed on the converted higher density block.

Figure 4:
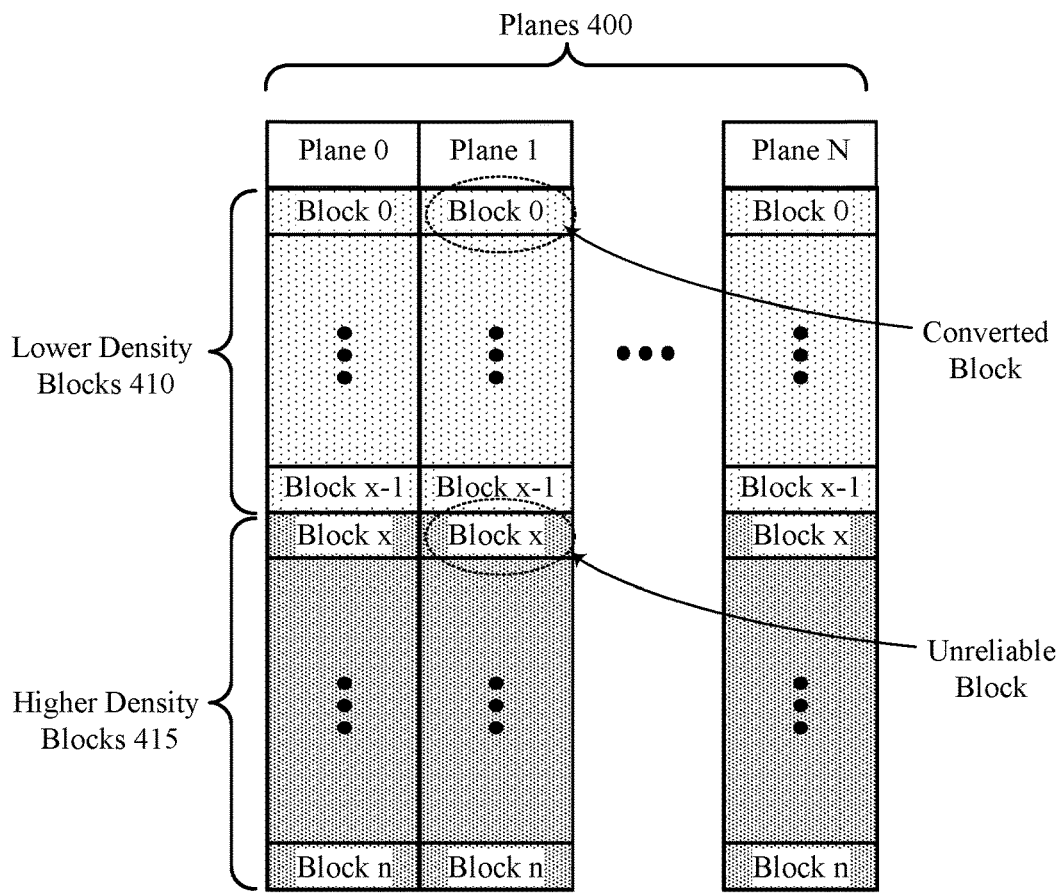
FIG. 4 illustrates an example of planes that support block conversion to preserve memory capacity in accordance with examples as disclosed herein.

FIG. 4 illustrates an example of planes 400 that support block conversion to preserve memory capacity in accordance with examples as disclosed herein. The planes 400 may be included in one or more memory devices in a memory system as described herein. The planes 400 may include plane 0 through plane N, which may be in the same or different logical units (LUNs). According to the techniques described herein, a device (e.g., a memory device, a memory system) may preserve capacity for storing host data by converting one or more lower density blocks in the planes 400 into one or more higher density blocks.

A plane 400 may include one or more lower density blocks 410 (e.g., SLC blocks) and one or more higher density blocks 415 (e.g., QLC blocks). The lower density blocks may include unexposed blocks for storing system information (e.g., metadata, L2P tables), exposed capacity blocks for storing host data, and cache blocks (unexposed, exposed, or both) for moving host data between a host device and the higher density blocks 415. The lower density blocks 410 in a plane 400 may have indices (e.g., physical addresses) 0 through x-1, in some examples. The higher density blocks 415 may include exposed capacity blocks for storing host data, among other blocks. The higher density blocks 415 in a plane 400 may have indices (e.g., physical addresses) x through n, in some examples.

If a higher density block, such as block x of plane 1, becomes unreliable, the device may retire the higher density block. To prevent a reduction of capacity for host data due to retiring the higher density block, the device may convert a lower density block, such as block 0 of plane 1, into a higher density block. The device may convert the lower density block into a higher density block, in some examples, by performing an erase operation associated with higher density blocks. If the device has spare blocks (e.g., spare higher density blocks, spare lower density blocks), the device may first exhaust the spare blocks (e.g., by replacing unreliable blocks with the spare blocks) before using block conversion to preserve capacity.

In some examples, the device may select for conversion a lower density block from the same plane (e.g., plane 1) as the unreliable higher density block, which may simplify overhead (e.g., L2P updates) associated with converting the lower density block. In some examples, the device may select a lower density cache block for conversion, which may allow the device to preserve more capacity than a lower density that is a capacity block (which already contributes to the capacity of the device).

If the lower density block is converted at initialization (e.g., before one or more access operations are performed on the lower density block), the remaining quantity of access operations for the converted higher density block may be equal to the retirement threshold for one or more higher capacity blocks (and thus may be equal to the retirement threshold for the retired higher capacity block). But if the lower density block is converted after initialization (e.g., after one or more access operations are performed on the lower density block), the remaining quantity of access operations for the converted higher density block may be less than the retirement threshold for one or more higher capacity blocks (e.g., because the lower density block has already been degraded).

To determine the remaining quantity of access operations for a lower density block that is converted after one or more access operations, the device may use a parameter, such as a conversion factor qc. In one example, the conversion factor may be based on (e.g., equal to, a function of) a ratio of a retirement threshold for one or more lower density blocks (denoted $R_{Thld\_Low}$) to a retirement threshold for one or more higher density blocks (denoted $R_{Thld\_High}$). For instance, $qc=R_{Thld\_Low}/R_{Thld\_High}$. In such an example, the remaining quantity of access operations (denoted $R_{AC}$) for the converted higher density block may be based on (e.g., equal to, a function of) the difference between the retirement threshold for one or more higher density blocks and the quotient of the quantity of access operations performed on the lower density block (denoted $P_{AC}$) divided by the conversion factor. For instance, $R_{AC}=R_{Thld\_High}-(P_{AC}/qc)$.

To illustrate, an example is provided in FIG. 4. In the example, the retirement threshold for the lower density blocks is 100,000 (e.g., $R_{Thld\_Low}=100,000$), the retirement threshold for the higher density blocks is 1735 (e.g., $R_{Thld\_High}=100,000$), the quantity of access operations performed on the lower density block (e.g., block 0) is 10,000 (e.g., $P_{AC\_Low}=10,000$), and the remaining quantity of access operations for the lower density block is 90,000 (e.g., $R_{AC\_Low}=90,000$). Using the conversion factor qc (e.g., qc=100,000/1735), the device may determine that the equivalent quantity of access operations performed on the converted higher density block is 174 (e.g., $P_{AC\_High}=174$). Accordingly, the device may determine that the remaining quantity of access operations for the converted higher density block (e.g., block 0) is 1561 (e.g., $R_{AC\_High}=1561$).

Other examples of the conversion factor qc are contemplated and within the scope of the current disclosure. For another example, among others, the conversion factor qc may be equal to $(1-P_{AC\_Low})/R_{Thld\_Low}$. In this example, $R_{AC\_High}$ may be equal to $R_{Thld\_Low} \times qc$.

After converting the lower density block into a higher density block, the device may operate the converted higher density block based on the remaining quantity of access operations for the converted higher density block. For example, the device may continue performing access operations on the converted higher density block (and adjusting, such as decrementing, the remaining quantity of access operations per access operation) until the remaining quantity of access operations is at or below a threshold (e.g., at or below a percentage of the remaining quantity of access operations, at or below a threshold quantity of access operations, at zero). Upon determining that the remaining quantity of access operations is at or below the threshold (e.g., at zero), the device may retire the converted higher density block. For example, the device may operate the converted higher density block as a read-only block or may take the converted higher density block offline (e.g., may avoid performing access operations on the converted higher density block, may power down the converted higher density block), among other options.

Thus, the device may preserve capacity for storing host data by converting lower density blocks into higher density blocks. Although described with reference to SLC blocks and QLC blocks in some examples, the conversion techniques described herein may be implemented using any combination of lower density blocks and higher density blocks.

Figure 5:
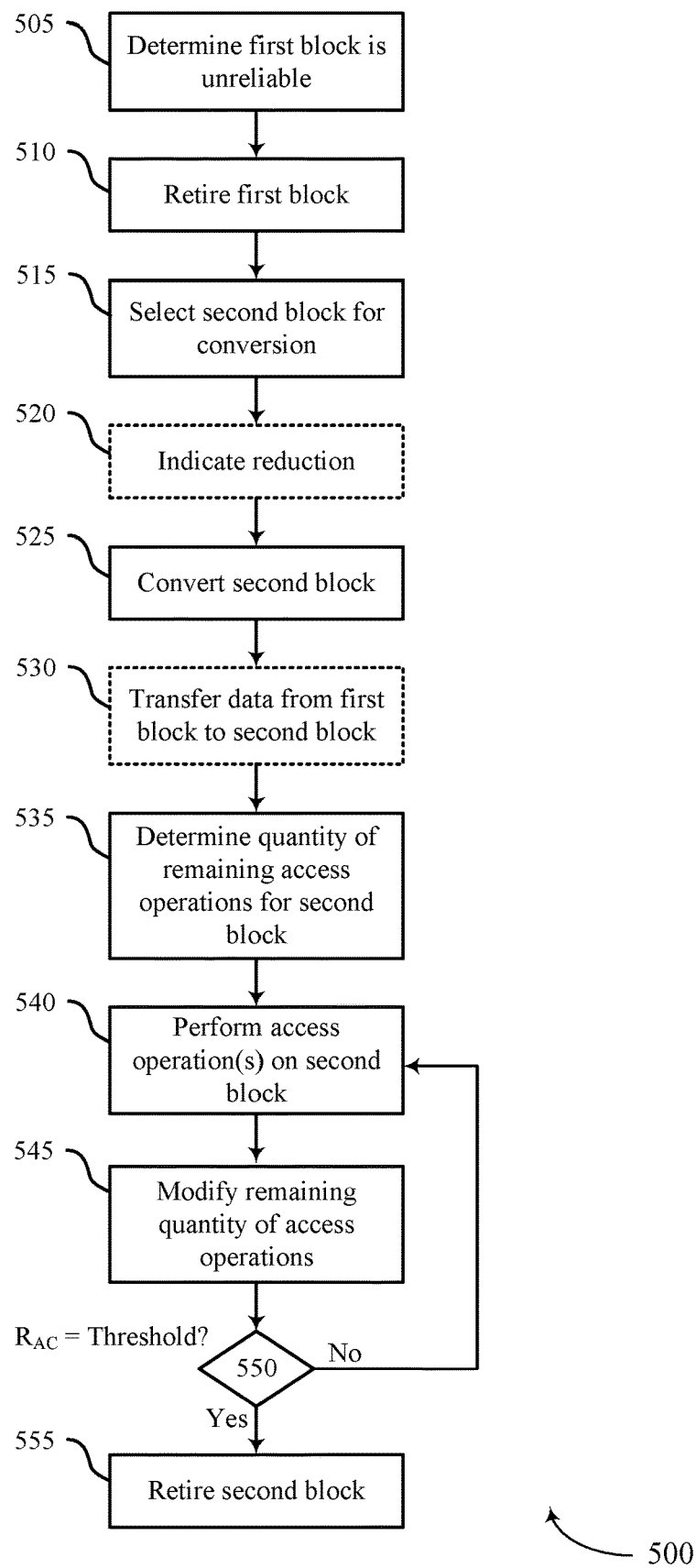
FIG. 5 illustrates an example of a process flow that supports block conversion to preserve memory capacity in accordance with examples as disclosed herein.

FIG. 5 illustrates an example of a process flow 500 that supports block conversion to preserve memory capacity in accordance with examples as disclosed herein. The process flow 500 may be implemented by a device such as a memory device or a memory system described herein. The device may include higher density blocks and lower density blocks. By implementing the process flow 500, the device may preserve storage capacity even if a higher density block is retired.

At 505, the device may determine that a first block is unreliable for storing information. The first block may be a higher density block that includes memory cells configured for storing a first quantity of bits. For example, the first block may be a QLC block that includes memory cells configured for storing four bits. As another example, the first block may be a TLC block that includes memory cells configured for storing three bits. As another example, the first block may be an MLC block that includes memory cells configured for storing two bits. In some examples, the device may determine that the first block is unreliable based on determining that the quantity of access operations performed on the first block is equal to the retirement threshold for higher density blocks.

At 510, the device may retire the first block. For example, the device may operate the first block as a read-only block or may take the first block offline (e.g., may avoid performing access operations on the first block, may power down the first block). The device may retire the first block based on determining that the first block is unreliable for storing information.

At 515, the device may select a second block for conversion. The second block may be a lower density block that includes memory cells configured for storing a second quantity of bits that is less than the first quantity of bits. In some examples (e.g., if the first block is a BLC block, a TLC block, or a QLC block), the second block may be an SLC block that includes memory cells configured for storing a single bit. In some examples (e.g., if the first block is a TLC block or a QLC block), the second block may be an SLC block or a BLC block. In some examples (e.g., if the first block is a QLC block), the second block may be an SLC block, an BLC block, or a TLC block. The device may select the second block for conversion based on the first block being unreliable, based on the first block being a higher density block than the second block, based on retiring the first block, one or more other characteristics or parameters, or any combination thereof.

In some examples, the device may select a cache block, such as an unexposed cache block, as the second block for conversion. Relative to other types of blocks (e.g., capacity blocks, which already contribute to capacity), selecting a cache block may allow the device to more fully realize capacity preservation from conversion. Relative to other types of blocks (e.g., exposed cache blocks), selecting an unexposed block may simplify overhead associated with conversion, among other benefits.

In some examples, the device may select the second block from the same plane, LUN, and/or memory device as the first block, which may simplify overhead associated with conversion, among other benefits. In some examples, the device may select the second block so that the second block has the longest remaining life (e.g., the highest quantity of remaining access operations) relative to other candidate blocks. For example, given a set of candidate blocks (e.g., unexposed cache blocks) for conversion, the device may select (as the second block) the candidate block that has been subject to the fewest quantity of access operations. Thus, the device may determine that fewer access operations have been performed on the second block relative to other candidate blocks and may select the second block for conversion based on the determination.

At 520, the device may transmit an indication that the quantity of blocks available for storing information is reduced. For example, the device may transmit a message with a MAR field that indicates the quantity of blocks available for storing information, which may be less than the quantity of blocks previously indicated by the device. The device may transmit the indication based on (e.g., in response to, after) selecting the second block for conversion (e.g., after 515 and before 525). Alternatively, the device may transmit the indication based on (e.g., in response to, after) converting the second block (e.g., after 525).

At 525, the device may convert the second block from a lower density block into a higher density block. For example, the device may convert the second block from an SLC block into a QLC block. In some examples, the device may convert the second block by performing on the second block an erase operation that is associated with the higher density blocks. For example, the device may perform on the second block a QLC erase operation, which may have a longer duration (e.g., four times longer) than an SLC erase operation. Thus, the device may configure the second block as a higher density block.

At 530, the device may transfer data from the first block to the second block so that the device can write the data to the second block. The device 530 may transfer the data based on determining the first block is unreliable and based on converting the second block. Additionally or alternatively, the device may update the L2P mapping for the device to reflect that the logical address mapped to the first block is now mapped to the second block.

At 535, the device may determine the quantity of remaining access operations for the second block (e.g., $R_{AC}$). The device may determine the quantity of remaining access operations based on (e.g., in response to) converting the second block. In some examples, the device may determine the quantity of remaining access operations based on (e.g., as a function of) a conversion factor. The conversion factor may be based on the retirement threshold for lower density blocks (e.g., $R_{Thld\_Low}$) and the retirement threshold for higher density blocks (e.g., $R_{Thld\_High}$) In some examples, the conversion factor may represent a ratio of the retirement threshold for lower density blocks and the retirement threshold for higher density blocks (e.g., $R_{Thld\_Low}/R_{Thld\_High}$).

In some examples, the device may determine the quantity of remaining access operations for the second block based on the quantity of access operations performed on the second block before the second block was converted (e.g., based on $P_{AC}$). For example, device may determine that the quantity of remaining access operations is based on (e.g., equal to, a function of) the difference between A) the retirement threshold for the higher density block (e.g., $R_{Thld\_High}$) and B) the quotient of the quantity of access operations performed on the second block (e.g., $P_{AC}$) and the conversion factor qc. Thus, the device may determine the remaining quantity of access operations for the second block based on the retirement threshold for the higher density blocks, the retirement threshold for the lower density block, the quantity of access operations performed on the second block, or any combination thereof.

At 540, the device may perform one or more access operation(s) on the second block. For example, the device may perform one or more erase operation(s) or one or more write operation(s). At 545, the device may modify (e.g., decrement) the quantity of remaining access operations for the second block based on performing the one or more access operations. For example, the device may decrement the quantity of remaining access operations if the device performed an erase operation on the second block. As another example, the device may decrement the quantity of remaining access operations if the device performed a threshold quantity of write operations on the second block (or if the device performed write operations on a threshold amount, e.g., 75%, of the second block).

At 550, the device may determine whether the quantity of remaining access operations satisfies (e.g., is equal to) a threshold value, such as zero. If, at 550, the device determines that the quantity of remaining access operations does not satisfy (e.g., is not equal to) the threshold value, the device may return to 540 and perform additional access operations on the second block. If, at 550, the device determines that the quantity of remaining access operations satisfies (e.g., is equal to) the threshold value, the device may proceed to 555 and retire the second block. For example, the device may operate the second block as a read-only block or may take the second block offline (e.g., may avoid performing access operations on the second block, may power down the second block).

Thus, the device will preserve storage capacity even if a higher density block is retired. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 6:
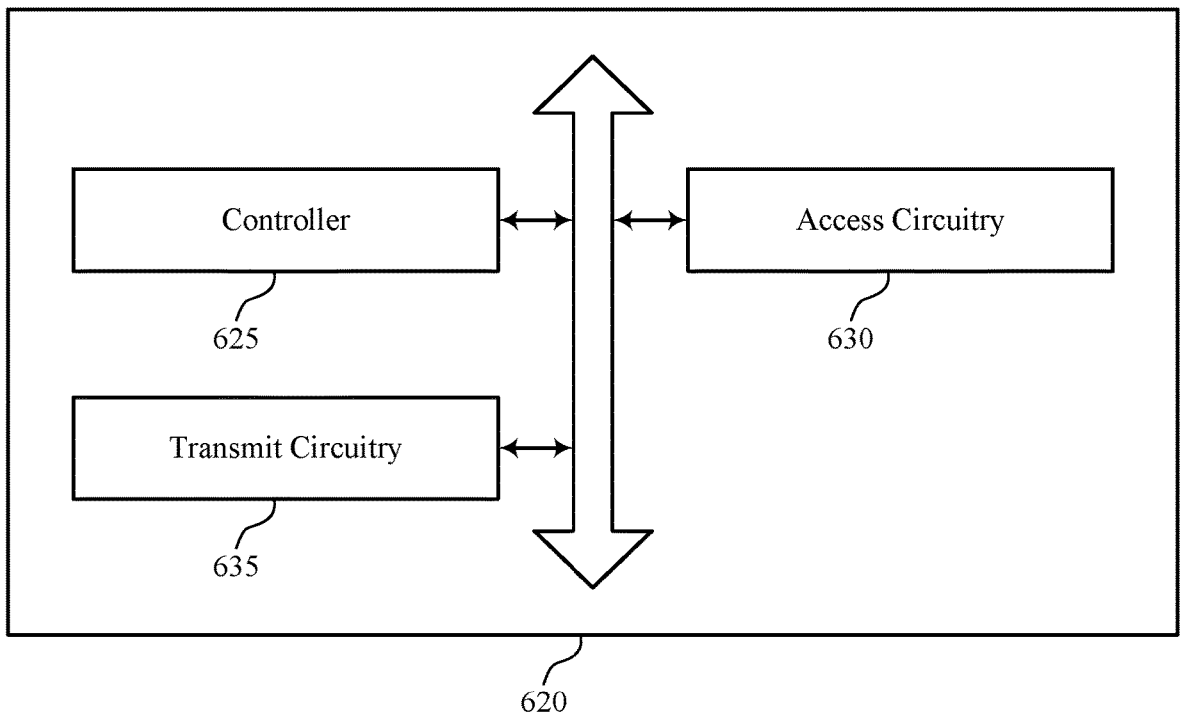
FIG. 6 shows a block diagram of a memory device that supports block conversion to preserve memory capacity in accordance with examples as disclosed herein.

FIG. 6 shows a block diagram 600 of a device 620 that supports block conversion to preserve memory capacity in accordance with examples as disclosed herein. The device 620 may be an example of aspects of a memory device or a memory system as described with reference to FIGS. 1 through 5. The device 620, or various components thereof, may be an example of means for performing various aspects of block conversion to preserve memory capacity as described herein. For example, the device 620 may include a controller 625, an access circuitry 630, a transmit circuitry 635, or any combination thereof. Each of these components may communicate, directly or indirectly, with one another (e.g., via one or more buses).

The controller 625 may be configured as or otherwise support a means for selecting a first block including a first set of memory cells based at least in part on a second block being unreliable for storing information, where each memory cell of the first set of memory cells is configured for storing a first quantity of one or more bits. The access circuitry 630 may be configured as or otherwise support a means for configuring each memory cell of the first set of memory cells in the first block for storing a second quantity of bits that is more than the first quantity of one or more bits based at least in part on the second block being unreliable. In some examples, the controller 625 may be configured as or otherwise support a means for determining, based at least in part on configuring the first set of memory cells for storing multiple, a remaining quantity of access operations permitted to be performed on the first block. In some examples, the controller 625 may be configured as or otherwise support a means for operating the first block based at least in part on the remaining quantity of access operations for the first block.

In some examples, the configuring occurs after performing a quantity of one or more access operations on the first block. In some examples, the remaining quantity of access operations is based at least in part on the quantity of one or more access operations performed on the first block.

In some examples, the transmit circuitry 635 may be configured as or otherwise support a means for transmitting, to a host system based at least in part on selecting the first block, an indication that a quantity of blocks available for storing information is reduced.

In some examples, the remaining quantity of access operations is based at least in part on a threshold quantity of access operations associated with the first block and a threshold quantity of access operations associated with the second block.

In some examples, to support operating the first block, the access circuitry 630 may be configured as or otherwise support a means for performing the remaining quantity of access operations on the first block. In some examples, to support operating the first block, the controller 625 may be configured as or otherwise support a means for operating the first block as a read-only block based at least in part on performing the remaining quantity of access operations on the first block.

In some examples, the controller 625 may be configured as or otherwise support a means for determining a conversion factor that represents a ratio of a threshold quantity of access operations associated with the first block and a threshold quantity of access operations associated with the second block, where the remaining quantity of access operations is based at least in part on the conversion factor.

In some examples, the controller 625 may be configured as or otherwise support a means for determining a quotient of a quantity of access operations performed on the first block and the conversion factor. In some examples, the controller 625 may be configured as or otherwise support a means for determining a difference between the quotient and the threshold quantity of access operations for the second block, where the remaining quantity is based at least in part on the difference.

In some examples, to support configuring the first block, the access circuitry 630 may be configured as or otherwise support a means for performing, on the first block, an erase operation that is associated with the second quantity of bits.

In some examples, the first block and the second block are included in a memory, and the controller 625 may be configured as or otherwise support a means for determining that the first block is a cache block for moving data between a host system and other blocks of the memory, where the first block is selected based at least in part on determining that the first block is the cache block.

In some examples, the controller 625 may be configured as or otherwise support a means for determining that the second block is in a plane of the memory, where the first block is selected based at least in part on the first block being in the same plane of the memory as the second block.

In some examples, the controller 625 may be configured as or otherwise support a means for determining that a quantity of access operations performed on the second block satisfies a threshold quantity, where the second block is determined to be unreliable based at least in part on the quantity of access operations performed on the second block satisfying the threshold quantity.

In some examples, the first block is included in a set of blocks each of which includes memory cells configured for storing the first quantity of one or more bits, and the controller 625 may be configured as or otherwise support a means for determining that fewer access operations have been performed on the first block relative to one or more other blocks in the set of blocks, where the first block is selected based at least in part on fewer access operations having been performed on the first block relative to the one or more other blocks in the set of blocks.

In some examples, the access circuitry 630 may be configured as or otherwise support a means for storing data from the second block in the first block based at least in part on the second block being unreliable and based at least in part on configuring each memory cell in the first set of memory cells for storing the second quantity of bits.

In some examples, the second block includes a second set of memory cells each of which is configured for storing the second quantity of bits. In some examples, an access operation includes a write operation or an erase operation.

In some examples, the access circuitry 630 may be configured as or otherwise support a means for performing a quantity of one or more access operations on a block that includes a set of memory cells configured as single-level cells each of which is configured for storing multiple bits. In some examples, the access circuitry 630 may be configured as or otherwise support a means for converting, after performing the quantity of one or more access operations on the block, the set of memory cells from single-level cells into multiple-level cells configured for storing multiple bits. In some examples, the controller 625 may be configured as or otherwise support a means for determining a remaining quantity of access operations permitted to be performed on the block based at least in part on the quantity of access operations performed on the block before converting the set of memory cells. In some examples, the controller 625 may be configured as or otherwise support a means for operating the block based at least in part on the remaining quantity of access operations.

In some examples, the controller 625 may be configured as or otherwise support a means for determining that a second block is unreliable for storing information, where the second block includes a second set of memory cells configured as multiple-level cells, and where the set of memory cells is converted based at least in part on the second block being unreliable.

In some examples, to support operating the block, the access circuitry 630 may be configured as or otherwise support a means for performing the remaining quantity of access operations on the block. In some examples, to support operating the block, the controller 625 may be configured as or otherwise support a means for operating the block as a read-only block based at least in part on performing the remaining quantity of access operations.

In some examples, the transmit circuitry 635 may be configured as or otherwise support a means for transmitting, to a host system, an indication that a quantity of blocks available for storing information is reduced, where the indication is transmitted based at least in part on converting the set of memory cells.

In some examples, the controller 625 may be configured as or otherwise support a means for determining a quotient of the quantity of access operations performed on the block and a conversion factor that is based at least in on a threshold quantity of access operations associated with single-level cells and a threshold quantity of access operations associated with multiple-level cells, where the remaining quantity is based at least in part on the quotient.

In some examples, the conversion factor represents a ratio of the threshold quantity of access operations associated with single-level cells and the threshold quantity of access operations associated with multiple-level cells, and the controller 625 may be configured as or otherwise support a means for determining a difference between the threshold quantity of access operations associated with multiple-level cells and the quotient, where the remaining quantity of access operations is based at least in part on the difference.

In some examples, the access circuitry 630 may be configured as or otherwise support a means for performing an erase operation on the block after converting the block. In some examples, the controller 625 may be configured as or otherwise support a means for decrementing the remaining quantity of access operations based at least in part on performing the erase operation.

Figure 7:
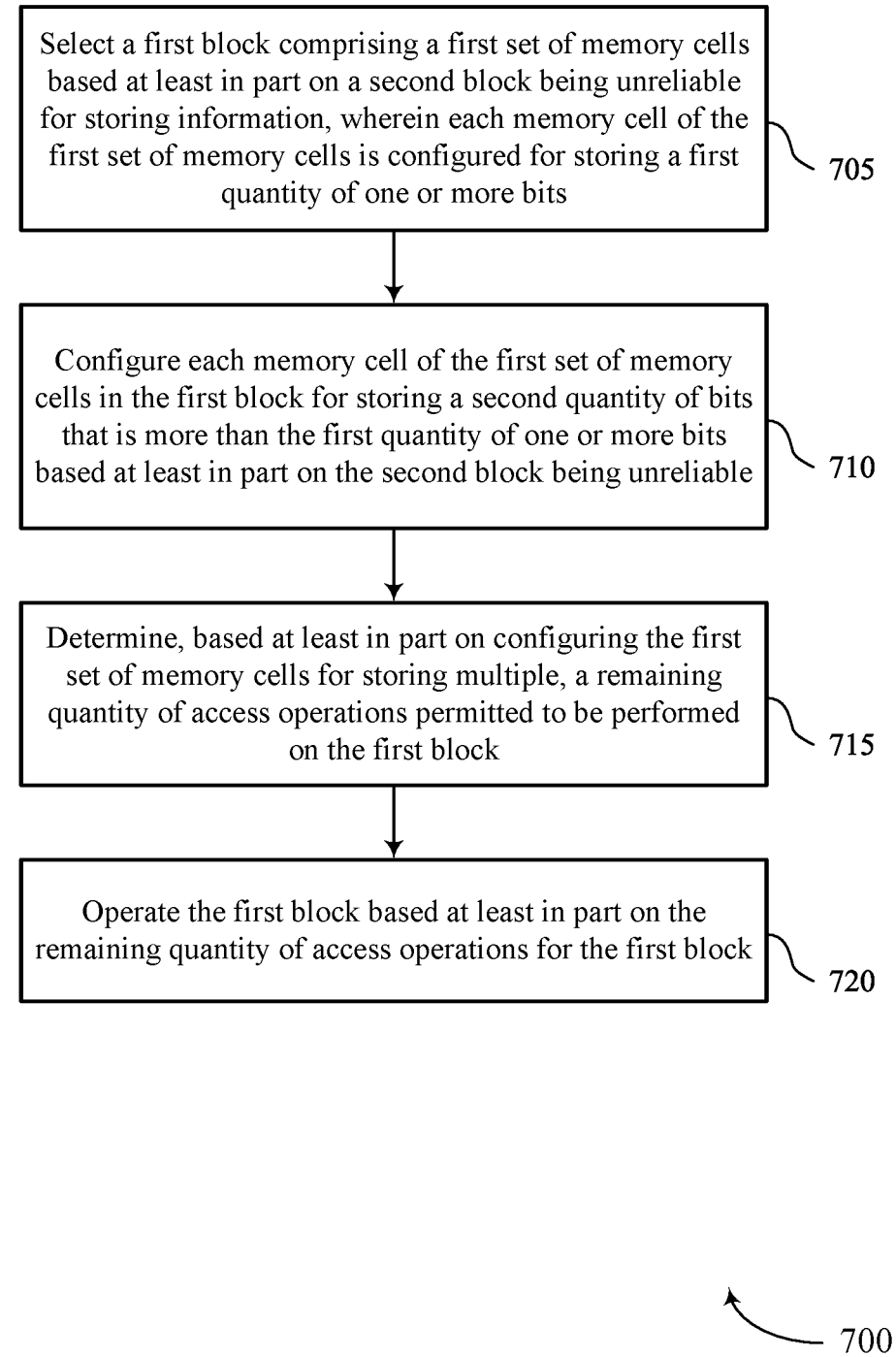
FIGS. 7 and 8 show flowcharts illustrating a method or methods that support block conversion to preserve memory capacity in accordance with examples as disclosed herein.

FIG. 7 shows a flowchart illustrating a method 700 that supports block conversion to preserve memory capacity in accordance with examples as disclosed herein. The operations of method 700 may be implemented by a device (e.g., a memory device or a memory system) or its components as described herein. For example, the operations of method 700 may be performed by a memory device or a memory system as described with reference to FIGS. 1 through 6. In some examples, a device may execute a set of instructions to control the functional elements of the device to perform the described functions. Additionally, or alternatively, the device may perform aspects of the described functions using special-purpose hardware.

At 705, the method may include selecting a first block including a first set of memory cells based at least in part on a second block being unreliable for storing information, where each memory cell of the first set of memory cells is configured for storing a first quantity of one or more bits. The operations of 705 may be performed in accordance with examples as disclosed herein. In some examples, aspects of the operations of 705 may be performed by a controller 625 as described with reference to FIG. 6.

At 710, the method may include configuring each memory cell of the first set of memory cells in the first block for storing a second quantity of bits that is more than the first quantity of one or more bits based at least in part on the second block being unreliable. The operations of 710 may be performed in accordance with examples as disclosed herein. In some examples, aspects of the operations of 710 may be performed by an access circuitry 630 as described with reference to FIG. 6.

At 715, the method may include determining, based at least in part on configuring the first set of memory cells for storing multiple, a remaining quantity of access operations permitted to be performed on the first block. The operations of 715 may be performed in accordance with examples as disclosed herein. In some examples, aspects of the operations of 715 may be performed by a controller 625 as described with reference to FIG. 6.

At 720, the method may include operating the first block based at least in part on the remaining quantity of access operations for the first block. The operations of 720 may be performed in accordance with examples as disclosed herein. In some examples, aspects of the operations of 720 may be performed by a controller 625 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for selecting a first block including a first set of memory cells based at least in part on a second block being unreliable for storing information, where each memory cell of the first set of memory cells is configured for storing a first quantity of one or more bits; configuring each memory cell of the first set of memory cells in the first block for storing a second quantity of bits that is more than the first quantity of one or more bits based at least in part on the second block being unreliable; determining, based at least in part on configuring the first set of memory cells for storing multiple, a remaining quantity of access operations permitted to be performed on the first block; and operating the first block based at least in part on the remaining quantity of access operations for the first block.

Aspect 2: The method, apparatus, or non-transitory computer-readable medium of aspect 1 where the configuring occurs after performing a quantity of one or more access operations on the first block and the remaining quantity of access operations is based at least in part on the quantity of one or more access operations performed on the first block.

Aspect 3: The method, apparatus, or non-transitory computer-readable medium of any of aspects 1 through 2, further including operations, features, circuitry, logic, means, or instructions, or any combination thereof for transmitting, to a host system based at least in part on selecting the first block, an indication that a quantity of blocks available for storing information is reduced.

Aspect 4: The method, apparatus, or non-transitory computer-readable medium of any of aspects 1 through 3 where the remaining quantity of access operations is based at least in part on a threshold quantity of access operations associated with the first block and a threshold quantity of access operations associated with the second block.

Aspect 5: The method, apparatus, or non-transitory computer-readable medium of any of aspects 1 through 4 where operating the first block includes operations, features, circuitry, logic, means, or instructions, or any combination thereof for performing the remaining quantity of access operations on the first block and operating the first block as a read-only block based at least in part on performing the remaining quantity of access operations on the first block.

Aspect 6: The method, apparatus, or non-transitory computer-readable medium of any of aspects 1 through 5, further including operations, features, circuitry, logic, means, or instructions, or any combination thereof for determining a conversion factor that represents a ratio of a threshold quantity of access operations associated with the first block and a threshold quantity of access operations associated with the second block, where the remaining quantity of access operations is based at least in part on the conversion factor.

Aspect 7: The method, apparatus, or non-transitory computer-readable medium of aspect 6, further including operations, features, circuitry, logic, means, or instructions, or any combination thereof for determining a quotient of a quantity of access operations performed on the first block and the conversion factor and determining a difference between the quotient and the threshold quantity of access operations for the second block, where the remaining quantity is based at least in part on the difference.

Aspect 8: The method, apparatus, or non-transitory computer-readable medium of any of aspects 1 through 7 where configuring the first block includes operations, features, circuitry, logic, means, or instructions, or any combination thereof for performing, on the first block, an erase operation that is associated with the second quantity of bits.

Aspect 9: The method, apparatus, or non-transitory computer-readable medium of any of aspects 1 through 8 where the first block and the second block are included in a memory and the method, apparatuses, and non-transitory computer-readable medium, further includes operations, features, circuitry, logic, means, or instructions, or any combination thereof for determining that the first block is a cache block for moving data between a host system and other blocks of the memory, where the first block is selected based at least in part on determining that the first block is the cache block.

Aspect 10: The method, apparatus, or non-transitory computer-readable medium of aspect 9, further including operations, features, circuitry, logic, means, or instructions, or any combination thereof for determining that the second block is in a plane of the memory, where the first block is selected based at least in part on the first block being in the same plane of the memory as the second block.

Aspect 11: The method, apparatus, or non-transitory computer-readable medium of any of aspects 1 through 10, further including operations, features, circuitry, logic, means, or instructions, or any combination thereof for determining that a quantity of access operations performed on the second block satisfies a threshold quantity, where the second block is determined to be unreliable based at least in part on the quantity of access operations performed on the second block satisfying the threshold quantity.

Aspect 12: The method, apparatus, or non-transitory computer-readable medium of any of aspects 1 through 11 where the first block is included in a set of blocks each of which includes memory cells configured for storing the first quantity of one or more bits and the method, apparatuses, and non-transitory computer-readable medium, further includes operations, features, circuitry, logic, means, or instructions, or any combination thereof for determining that fewer access operations have been performed on the first block relative to one or more other blocks in the set of blocks, where the first block is selected based at least in part on fewer access operations having been performed on the first block relative to the one or more other blocks in the set of blocks.

Aspect 13: The method, apparatus, or non-transitory computer-readable medium of any of aspects 1 through 12, further including operations, features, circuitry, logic, means, or instructions, or any combination thereof for storing data from the second block in the first block based at least in part on the second block being unreliable and based at least in part on configuring each memory cell in the first set of memory cells for storing the second quantity of bits.

Aspect 14: The method, apparatus, or non-transitory computer-readable medium of any of aspects 1 through 13 where the second block includes a second set of memory cells each of which is configured for storing the second quantity of bits and an access operation includes a write operation or an erase operation.

Figure 8:
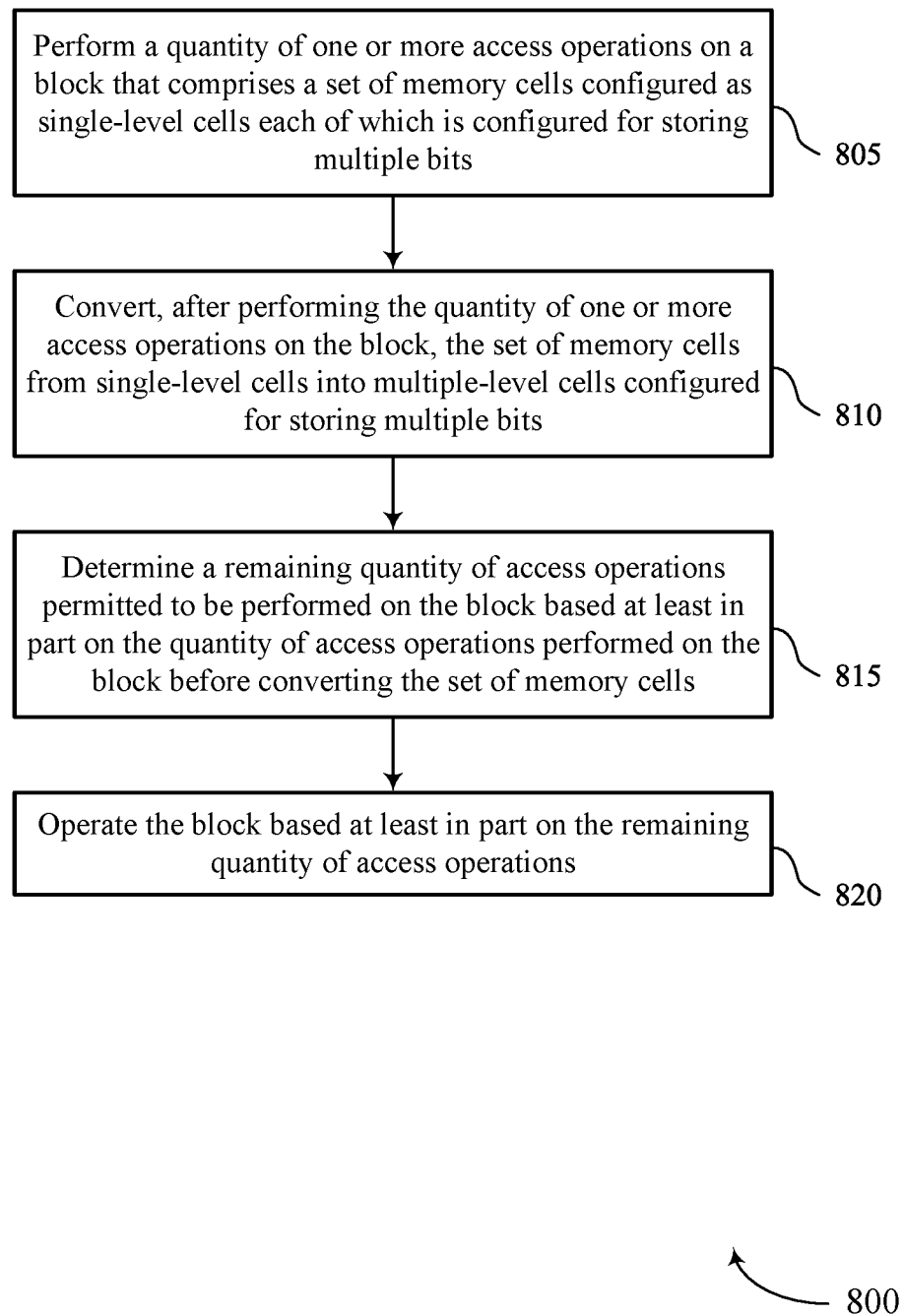

FIG. 8 shows a flowchart illustrating a method 800 that supports block conversion to preserve memory capacity in accordance with examples as disclosed herein. The operations of method 800 may be implemented by a device (e.g., a memory device or a memory system) or its components as described herein. For example, the operations of method 800 may be performed by a memory device or a memory system as described with reference to FIGS. 1 through 6. In some examples, a device may execute a set of instructions to control the functional elements of the device to perform the described functions. Additionally, or alternatively, the device may perform aspects of the described functions using special-purpose hardware.

At 805, the method may include performing a quantity of one or more access operations on a block that includes a set of memory cells configured as single-level cells each of which is configured for storing multiple bits. The operations of 805 may be performed in accordance with examples as disclosed herein. In some examples, aspects of the operations of 805 may be performed by an access circuitry 630 as described with reference to FIG. 6.

At 810, the method may include converting, after performing the quantity of one or more access operations on the block, the set of memory cells from single-level cells into multiple-level cells configured for storing multiple bits. The operations of 810 may be performed in accordance with examples as disclosed herein. In some examples, aspects of the operations of 810 may be performed by an access circuitry 630 as described with reference to FIG. 6.

At 815, the method may include determining a remaining quantity of access operations permitted to be performed on the block based at least in part on the quantity of access operations performed on the block before converting the set of memory cells. The operations of 815 may be performed in accordance with examples as disclosed herein. In some examples, aspects of the operations of 815 may be performed by a controller 625 as described with reference to FIG. 6.

At 820, the method may include operating the block based at least in part on the remaining quantity of access operations. The operations of 820 may be performed in accordance with examples as disclosed herein. In some examples, aspects of the operations of 820 may be performed by a controller 625 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 15: A method, apparatus, or non-transitory computer-readable medium including operations, features, circuitry, logic, means, or instructions, or any combination thereof for performing a quantity of one or more access operations on a block that includes a set of memory cells configured as single-level cells each of which is configured for storing multiple bits; converting, after performing the quantity of one or more access operations on the block, the set of memory cells from single-level cells into multiple-level cells configured for storing multiple bits; determining a remaining quantity of access operations permitted to be performed on the block based at least in part on the quantity of access operations performed on the block before converting the set of memory cells; and operating the block based at least in part on the remaining quantity of access operations.

Aspect 16: The method, apparatus, or non-transitory computer-readable medium of aspect 15, further including operations, features, circuitry, logic, means, or instructions, or any combination thereof for determining that a second block is unreliable for storing information, where the second block includes a second set of memory cells configured as multiple-level cells, and where the set of memory cells is converted based at least in part on the second block being unreliable.

Aspect 17: The method, apparatus, or non-transitory computer-readable medium of any of aspects 15 through 16 where operating the block includes operations, features, circuitry, logic, means, or instructions, or any combination thereof for performing the remaining quantity of access operations on the block and operating the block as a read-only block based at least in part on performing the remaining quantity of access operations.

Aspect 18: The method, apparatus, or non-transitory computer-readable medium of any of aspects 15 through 17, further including operations, features, circuitry, logic, means, or instructions, or any combination thereof for transmitting, to a host system, an indication that a quantity of blocks available for storing information is reduced, where the indication is transmitted based at least in part on converting the set of memory cells.

Aspect 19: The method, apparatus, or non-transitory computer-readable medium of any of aspects 15 through 18, further including operations, features, circuitry, logic, means, or instructions, or any combination thereof for determining a quotient of the quantity of access operations performed on the block and a conversion factor that is based at least in on a threshold quantity of access operations associated with single-level cells and a threshold quantity of access operations associated with multiple-level cells, where the remaining quantity is based at least in part on the quotient.

Aspect 20: The method, apparatus, or non-transitory computer-readable medium of aspect 19 where the conversion factor represents a ratio of the threshold quantity of access operations associated with single-level cells and the threshold quantity of access operations associated with multiple-level cells and the method, apparatuses, and non-transitory computer-readable medium, further includes operations, features, circuitry, logic, means, or instructions, or any combination thereof for determining a difference between the threshold quantity of access operations associated with multiple-level cells and the quotient, where the remaining quantity of access operations is based at least in part on the difference.

Aspect 21: The method, apparatus, or non-transitory computer-readable medium of any of aspects 15 through 20, further including operations, features, circuitry, logic, means, or instructions, or any combination thereof for performing an erase operation on the block after converting the block and decrementing the remaining quantity of access operations based at least in part on performing the erase operation.

It should be noted that the described techniques include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 22: An apparatus, including: a memory; and a controller coupled with the memory and configured to cause the apparatus to: select a first block including a first set of memory cells based at least in part on a second block being unreliable for storing information, where each memory cell of the first set of memory cells is configured for storing a first quantity of one or more bits; configure, after performing a quantity of one or more access operations on the first block, each memory cell of the first set of memory cells in the first block for storing a second quantity of bits that is more than the first quantity of one or more bits based at least in part on the second block being unreliable; determine, based at least in part on configuring the first set of memory cells for storing multiple, a remaining quantity of access operations permitted to be performed on the first block; and operate the first block based at least in part on the remaining quantity of access operations for the first block.

Aspect 23: The apparatus of aspect 22, where the remaining quantity of access operations is based at least in part on a threshold quantity of access operations associated with the first block and a threshold quantity of access operations associated with the second block.

Aspect 24: The apparatus of any of aspects 22 through 23, where the controller is further configured to cause the apparatus to: determine a conversion factor that represents a ratio of a threshold quantity of access operations associated with the first block and a threshold quantity of access operations associated with the second block, where the remaining quantity of access operations is based at least in part on the conversion factor.

Aspect 25: The apparatus of aspect 24, where the controller is further configured to cause the apparatus to: determine a quotient of a quantity of access operations performed on the first block before configuring the first set of memory cells and the conversion factor; and determine a difference between the quotient and the threshold quantity of access operations for the second block, where the remaining quantity is based at least in part on the difference.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The terms "if" "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   selecting a first block comprising a first set of memory cells based at least in part on determining that a second block is unreliable for storing information, wherein each memory cell of the first set of memory cells is configured for storing a first quantity of one or more bits;
   configuring each memory cell of the first set of memory cells in the first block for storing a second quantity of bits that is more than the first quantity of one or more bits based at least in part on determining that the second block is unreliable;
   determining, based at least in part on configuring the first set of memory cells for storing the second quantity of bits, a remaining quantity of access operations permitted to be performed on the first block, wherein the remaining quantity of access operations for the first block is based at least in part on a ratio between a first threshold quantity of access operations associated with the first block and a second threshold quantity of access operations associated with the second block; and
   operating the first block based at least in part on the remaining quantity of access operations for the first block.

2. The method of claim 1, wherein the configuring occurs after performing a quantity of one or more access operations on the first block, and wherein the remaining quantity of access operations is based at least in part on the quantity of one or more access operations performed on the first block.

3. The method of claim 1, further comprising:
   transmitting, to a host system based at least in part on selecting the first block, an indication that a quantity of blocks available for storing information is reduced.

4. The method of claim 1, wherein operating the first block comprises:
   performing the remaining quantity of access operations on the first block; and
   operating the first block as a read-only block based at least in part on performing the remaining quantity of access operations on the first block.

5. The method of claim 1, wherein configuring the first block comprises:
   performing, on the first block, an erase operation that is associated with the second quantity of bits.

6. The method of claim 1, wherein the first block and the second block are included in a memory, the method further comprising:
   determining that the first block is a cache block for moving data between a host system and other blocks of the memory, wherein the first block is selected based at least in part on determining that the first block is the cache block.

7. The method of claim 6, further comprising:
   determining that the second block is in a plane of the memory, wherein the first block is selected based at least in part on the first block being in a same plane of the memory as the second block.

8. The method of claim 1, further comprising:
determining that a quantity of access operations performed on the second block satisfies a threshold quantity, wherein the second block is determined to be unreliable based at least in part on the quantity of access operations performed on the second block satisfying the threshold quantity.

9. The method of claim 1, wherein the first block is included in a set of blocks each of which comprises memory cells configured for storing the first quantity of one or more bits, the method further comprising:
determining that fewer access operations have been performed on the first block relative to one or more other blocks in the set of blocks, wherein the first block is selected based at least in part on fewer access operations having been performed on the first block relative to the one or more other blocks in the set of blocks.

10. The method of claim 1, further comprising:
storing data from the second block in the first block based at least in part on the second block being unreliable and based at least in part on configuring each memory cell in the first set of memory cells for storing the second quantity of bits.

11. The method of claim 1, wherein the second block comprises a second set of memory cells each of which is configured for storing the second quantity of bits, and wherein an access operation comprises a write operation or an erase operation.

12. A method of claim 6, further comprising:
selecting a first block comprising a first set of memory cells based at least in part on determining that a second block is unreliable for storing information, wherein each memory cell of the first set of memory cells is configured for storing a first quantity of one or more bits;
configuring each memory cell of the first set of memory cells in the first block for storing a second quantity of bits that is more than the first quantity of one or more bits based at least in part on determining that the second block is unreliable;
determining a conversion factor that represents a ratio of a threshold quantity of access operations associated with the first block and a threshold quantity of access operations associated with the second block;
determining a quotient of a quantity of access operations performed on the first block and the conversion factor;
determining a difference between the quotient and the threshold quantity of access operations for the second block;
determining, based at least in part on configuring the first set of memory cells for storing the second quantity of bits, a remaining quantity of access operations permitted to be performed on the first block, wherein the remaining quantity is based at least in part on the difference; and
operating the first block based at least in part on the remaining quantity of access operations for the first block.

13. A memory system, comprising:
one or more memory devices; and
one or more controllers coupled with the one or more memory devices and configured to cause the memory system to:
select a first block comprising a first set of memory cells based at least in part on determining that a second block is unreliable for storing information, wherein each memory cell of the first set of memory cells is configured for storing a first quantity of one or more bits;
configure, after performing a quantity of one or more access operations on the first block, each memory cell of the first set of memory cells in the first block for storing a second quantity of bits that is more than the first quantity of one or more bits based at least in part on determining that the second block is unreliable;
determine, based at least in part on configuring the first set of memory cells for storing the second quantity of bits, a remaining quantity of access operations permitted to be performed on the first block, wherein the remaining quantity of access operations for the first block is determined based at least in part on a ratio between a first threshold quantity of access operations associated with the first block and a second threshold quantity of access operations associated with the second block; and
operate the first block based at least in part on the remaining quantity of access operations for the first block.

14. A memory system, comprising:
one or more memory devices; and
one or more controllers coupled with the one or more memory devices and configured to cause the memory system to:
select a first block comprising a first set of memory cells based at least in part on determining that a second block is unreliable for storing information, wherein each memory cell of the first set of memory cells is configured for storing a first quantity of one or more bits;
configure, after performing a quantity of one or more access operations on the first block, each memory cell of the first set of memory cells in the first block for storing a second quantity of bits that is more than the first quantity of one or more bits based at least in part on determining that the second block is unreliable;
determine a conversion factor that represents a ratio of a threshold quantity of access operations associated with the first block and a threshold quantity of access operations associated with the second block;
determine a quotient of a quantity of access operations performed on the first block before configuring the first set of memory cells and the conversion factor;
determine a difference between the quotient and the threshold quantity of access operations for the second block;
determine, based at least in part on configuring the first set of memory cells for storing the second quantity of bits, a remaining quantity of access operations permitted to be performed on the first block, wherein the remaining quantity is based at least in part on the difference; and
operate the first block based at least in part on the remaining quantity of access operations for the first block.

15. A method, comprising:
performing a quantity of one or more access operations on a block that comprises a set of memory cells configured as single-level cells each of which is configured for storing multiple bits;
converting, after performing the quantity of one or more access operations on the block and based at least in part on determining that a second block is unreliable for storing information, the set of memory cells from single-level cells into multiple-level cells configured for storing multiple bits;
determining a remaining quantity of access operations permitted to be performed on the block based at least in part on converting the set of memory cells, wherein the remaining quantity of access operations is determined based at least in part on; the quantity of access operations performed on the block before converting the set of memory cells, a first threshold quantity of access operations associated with the block, and a second threshold quantity of access operations associated with the second block; and
operating the block based at least in part on the remaining quantity of access operations.

16. The method of claim 15, further comprising:
determining that a second block is unreliable for storing information, wherein the second block comprises a second set of memory cells configured as multiple-level cells, and wherein the set of memory cells is converted based at least in part on the second block being unreliable.

17. The method of claim 15, further comprising:
transmitting, to a host system, an indication that a quantity of blocks available for storing information is reduced, wherein the indication is transmitted based at least in part on converting the set of memory cells.

18. The method of claim 15, further comprising:
determining a quotient of the quantity of access operations performed on the block and a conversion factor that is based at least in on the first threshold quantity and the second threshold quantity, wherein the first threshold quantity comprises a threshold quantity of access operations associated with single-level cells, wherein the second threshold quantity of access operations is associated with multiple-level cells, and wherein the remaining quantity is based at least in part on the quotient.

19. The method of claim 15, further comprising:
performing an erase operation on the block after converting the block; and
decrementing the remaining quantity of access operations based at least in part on performing the erase operation.

20. The method of claim 15, wherein operating the block comprises:
performing the remaining quantity of access operations on the block; and
operating the block as a read-only block based at least in part on performing the remaining quantity of access operations.

21. A method comprising:
selecting a first block comprising a first set of memory cells based at least in part on determining that a second block is unreliable for storing information, wherein each memory cell of the first set of memory cells is configured for storing a first quantity of one or more bits;
configuring each memory cell of the first set of memory cells in the first block for storing a second quantity of bits that is more than the first quantity of one or more bits based at least in part on determining that the second block is unreliable;
determining a quotient of a quantity of access operations performed on the first block and a conversion factor that is based at least in on a threshold quantity of access operations associated with single-level cells and a threshold quantity of access operations associated with multiple-level cells, wherein the conversion factor represents a ratio of the threshold quantity of access operations associated with single-level cells and the threshold quantity of access operations associated with multiple-level cells:
determining a difference between the threshold quantity of access operations associated with multiple-level cells and the quotient;
determining, based at least in part on configuring the first set of memory cells for storing the second quantity of bits, a remaining quantity of access operations permitted to be performed on the first block, wherein the remaining quantity of access operations is based at least in part on the difference; and
operating the first block based at least in part on the remaining quantity of access operations for the first block.

* * * * *